United States Patent
Matsumoto et al.

[11] Patent Number: 5,327,445
[45] Date of Patent: Jul. 5, 1994

[54] QUANTUM-WELL TYPE SEMICONDUCTOR LASER DEVICE

[75] Inventors: Narihito Matsumoto, Yokohama; Akihiko Kasukawa, Tokyo; Takeshi Namegaya, Kanagawa; Hiroshi Okamoto, Tokyo, all of Japan

[73] Assignee: The Furukawa Electric Co., Ltd., Tokyo, Japan

[21] Appl. No.: 854,646

[22] PCT Filed: Sep. 12, 1991

[86] PCT No.: PCT/JP91/01213
§ 371 Date: Jul. 9, 1992
§ 102(e) Date: Jul. 9, 1992

[87] PCT Pub. No.: WO92/04753
PCT Pub. Date: Mar. 19, 1992

[30] Foreign Application Priority Data

Sep. 12, 1990 [JP] Japan ............ 2-241554
Sep. 13, 1990 [JP] Japan ............ 2-243074
Nov. 30, 1990 [JP] Japan ............ 2-336546

[51] Int. Cl.⁵ .............................. H01S 3/19
[52] U.S. Cl. ........................... 372/45; 372/46
[58] Field of Search ..................... 372/45, 46

[56] References Cited

U.S. PATENT DOCUMENTS

| 4,841,533 | 6/1989 | Hayakawa et al. | 372/45 |
| 4,862,470 | 8/1989 | Suyama et al. | 372/45 |
| 4,887,274 | 12/1989 | Hayakawa et al. | 372/45 |

FOREIGN PATENT DOCUMENTS

60-72283  4/1985  Japan.

*Primary Examiner*—Georgia Y. Epps
*Attorney, Agent, or Firm*—Jacobson, Price, Holman & Stern

[57] ABSTRACT

In a quantum-well type semiconductor laser device comprising a multi-layered quantum-well layer (active layer) constituted by quantum-well layers and a corresponding number of barrier layers and a pair of optical confinement layers respectively arranged on and under the active layer, since the number of quantum-well layers is limited to one or two, the device has a reduced internal loss, a narrowed far-field angle and a bandgap energy of the quantum-well layers greater than that of the optical confinement layers by more than 160 meV so that it shows a lowered threshold current density. Besides, by selecting a thickness of the quantum-well layers between 3 and 8 nm, the device can be made to oscillate at the first quantum level in order to make the oscillation wavelength highly dependent on temperature and optical output and accordingly produce a high spectral purity.

4 Claims, 4 Drawing Sheets

PRESENT INVENTION

CONVENTIONAL ONE
HAVING BULK ACTIVE LAYER

BAND GAP WAVELENGTH, $\mu$m

QUANTUM-WELL TYPE SEMICONDUCTOR LASER DEVICE

BACKGROUND OF THE INVENTION

1. Technical Field

This invention relates to a quantum-well type semiconductor laser device capable of oscillating at a wavelength between 1.3 and 1.6 μm.

2. Background Art

A semiconductor laser device with quantum-well type structural features has a low threshold current density, when compared with a semiconductor laser device having active layers of bulk crystals, and is capable of reducing its internal loss to show a narrowed far-field angle (beam spreading) by reducing the number of quantum-well layers. These and other characteristics of a quantum-well type semiconductor laser device make it a promising candidate for popular use in the future.

There have been known semiconductor laser devices of distribution feedback type having a quantum-well structure that operate in a single longitudinal mode. FIG. 7 schematically illustrates such a semiconductor laser device having band gaps.

A semiconductor laser device as shown in FIG. 7 comprises a number of layers formed on an n-InP substrate 1 and arranged in a given manner, including an n-InP clad layer 2, a non-doped GaInAsP optical confinement layer 3, a multiple quantum-well layer 4 which comprises a plurality of alternately arranged non-doped GaInAsP quantum-well layers 5 and GaInAsP barrier layers 6, a non-doped GaInAsP optical confinement layer 7 in which a diffraction grating 8 is formed, a p-InP clad layer 9, a p-GaInAsP contact layer 10 and a buried layer 11 which is constituted by a p-InP layer 11a and an n-InP layer 11b along with an n-side electrode 12 arranged under the substrate 1 and a p-side electrode 13 arranged on the buried layer 11. The layers of FIG. 7 have the following specified characteristic values.

| | |
|---|---|
| optical confinement layer 3 | band gap wavelength - 1.3 μm, thickness - 1,200Å |
| quantum-well layer 5 | band gap wavelength - 1.67 μm, thickness - 100Å |
| barrier layer 6 | band gap wavelength - 1.3 μm, thickness - 150Å |
| optical confinement layer 7 | band gap wavelength - 1.3 μm, thickness 1,200Å |
| primary diffraction grating 8 | pitch - 2,400Å height - 500Å |

The paper listed below, or Paper 1, reports that the spectral purity of a semiconductor laser device having a quantum-well structure can be improved by reducing the number of quantum-well layers which are active layers.

Paper 1: IEEE, JOURNAL QUANTUM ELECTRONICS, Vol. QE-21, No. 10, pp. 1666-1674, 1985.

If, however, the number of quantum-wells of a semiconductor laser device having a structure as described above is reduced to 1 or 2, the optical confinement factor of the device is reduced to significantly decrease the gain of the device and consequently make the threshold carrier density required for oscillation rather high.

If, by turn, the threshold carrier density for oscillation of such a device is high in a longwave region, the efficiency of light emission of the device is inevitably deteriorated by a non-light emitting mechanism inherent in the device, typically involving Auger effect or inter-valence band absorption. Consequently, the oscillation threshold current can raise remarkably to allow oscillation to take place only at the second quantum level or in the optical confinement layers owing to high carrier injection.

Thus, the spectral purity of any known semiconductor laser device cannot be improved by simply reducing the number of quantum-well layers.

The paper below, or Paper 2, discloses a semiconductor laser device that comprises four quantum-well layers with a band gap wavelength of 1.67 μm and a thickness between 50 and 250Å and GRIN-SCH layers with respective band gap wavelengths of 14 μm, 1.33 μm, 1.25 μm and 1.14 μm and a thickness between 150 and 300Å, where the difference between the band gap of the quantum-well layers and that of the innermost GRIN-SCH layer is 143 meV.

Paper 2: Appl. Phys. Lett., Vol. 55, No. 22. pp. 2283-2285, 1989.

In order for a semiconductor laser device of the above described type to oscillate at the first quantum level, the above band gap difference needs to be greater than 160 meV. Therefore, the device having a band gap difference of 143 meV is accompanied by the problem of oscillation only at the second quantum level and a high threshold current density.

Moreover, Paper 2 does not disclose any technological improvement for reducing the internal loss, narrowing the far-field angle and improving the temperature dependency of the oscillation wavelength of the semiconductor laser device.

SUMMARY OF THE INVENTION

In view of the above described technological problems, it is therefore an object of the present invention to provide a quantum-well type semiconductor laser device that have a low threshold current density, a reduced internal loss, a narrowed far-field angle and only one or two quantum-well layers and still can oscillate at the first quantum level.

According to the invention, the above object is achieved by providing a quantum-well type semiconductor laser device comprising an active layer constituted by one or more than one quantum-well layers and a barrier layer and $Ga_xIn_{1-x}As_yP_{1-y}$ ($x \geq 0$, $y \leq$) semiconductive layers including a pair of optical confinement layers arranged on and under said active layer, said layers being formed on an InP substrate in a given arrangement, wherein the number of said quantum-well layers is one or two and the bandgap energy of the optical confinement layers is greater than that of the quantum-well layer(s) by 160 meV and the thickness of the quantum-well layer(s) is between 3 nm and 8 nm.

A quantum-well type semiconductor laser device according to the invention may additionally comprise an InP layer arranged outside the optical confinement layers and having a bandgap energy greater than that of the latter.

The amount of the strain in the quantum-well layer(s) of a quantum-well type semiconductor laser device according to the invention is preferably between 0 and 2% relative to the InP substrate and/or the optical confinement layers.

A quantum-well type semiconductor laser device according to the invention preferably has a cavity length greater than 900 μm.

A quantum-well type semiconductor laser device according to the invention has improved properties described below and obtained by employing a GRIN-SCH structure on the new findings acquired through a series of experiments conducted by the inventors of the present invention.

Firstly, the internal loss is reduced, the far-field angle is narrowed and the spectral purity is improved by providing the semiconductor laser device with only one or two quantum-well layers.

Secondly, the threshold current density can be lowered by providing the optical confinement layers of the semiconductor laser device with a bandgap energy greater than that of the quantum-well layer(s) by 160 meV and therefore the band gap difference between the quantum-well layer(s) and the innermost GRIN-SCH layer is greater than 160 meV.

When the above value is less than 160 meV, a semiconductor laser device of the type under consideration oscillates only at the second quantum level and shows a high threshold current level regardless of the thickness of the quantum-well layer(s).

Thirdly, the semiconductor laser device oscillates at the first quantum level that shows an advantageous dependency of the oscillation wavelength on temperature and optical output.

The semiconductor laser device oscillates in the optical confinement layers when the thickness of the quantum-well layer(s) is less than 3 nm, whereas it oscillates at the second quantum level when the thickness of the quantum-well layer(s) exceeds 8 nm.

The above described properties derive from the fact that each of the layers of the semiconductor laser device is of lattice match.

The threshold current density can be further reduced and the quantum efficiency can be further enhanced when the amount of the strain in the quantum-well layer(s) of the semiconductor laser device is between 0 and 2% relative to the InP substrate and/or the optical confinement layers.

The carrier can be effectively confined within the quantum-well layer(s) and oscillation at the first quantum level can be stabilized when an InP layer having a bandgap energy greater than that of the optical confinement layers is arranged outside the latter.

It has been found by the inventors of the present invention that, when only one or two quantum-well layers are provided, a cavity length of approximately 900 μm can minimize the threshold current of the semiconductor laser device. The quantum efficiency of the semiconductor laser device can be held to a high level so long as the device has a cavity length greater than 900 μm.

When the cavity length is greater than 900 μm, the semiconductor laser device additionally shows a reduced resistance and an enhanced heat diffusing capability to ensure its high output operation.

While the cavity length is preferably greater than 900 μm, a smaller cavity length may be permissible for a semiconductor laser device according to the invention so long as it does not adversely affect the performance of the device in applications.

DETAILED DESCRIPTION OF THE PREFERRED EMBODIMENTS

Figure 1:
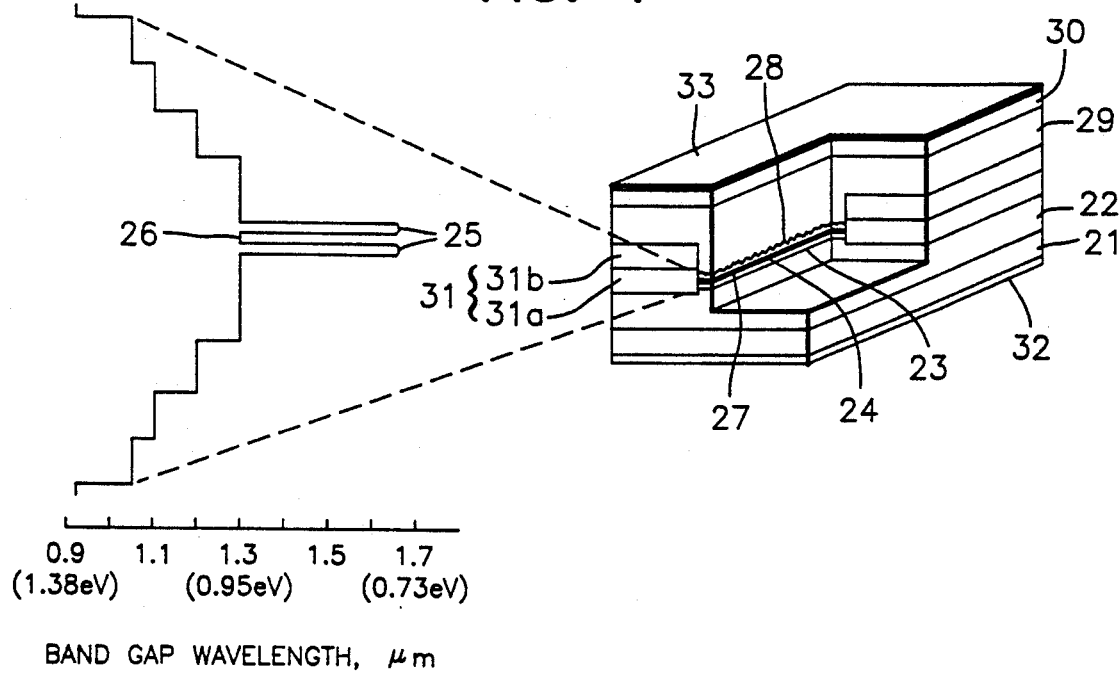
FIG. 1 is a partially cut out perspective view of a preferred embodiment of the quantum-well type semiconductor laser device according to the invention shown with a graph of its band gap wavelength.

A preferred embodiment of the quantum-well type semiconductor laser device according to the invention as illustrated in FIG. 1 has a configuration as described below.

Referring to FIG. 1, the embodiment comprises an n-InP clad layer 22, a non-doped GaInAsP optical confinement layer 23 having a forbidden bandwidth that changes stepwise, a multi-layered quantum-well layer 24 constituted by non-doped GaInAsP quantum-well layers 25 and a GaInAsP barrier layer 26, a non-doped GaInAsP optical confinement layer 27 having a bandgap energy that changes stepwise, a primary diffraction grating 28 cut on said optical confinement layer 27, a p-InP clad layer 29, a p-GaInAsP contact layer 30, a buried layer 31 constituted by a p-InP layer 31a and an n-InP layer 31b formed on an n-InP substrate 21 and arranged in a given manner. Additionally, the embodiment comprises an n-side electrode 32 arranged under the substrate 21 and a p-side electrode 33 arranged on the upper surface of the buried layer 31.

The layers of FIG. 1 have the following specified characteristic values.

non-doped GaInAsP optical confinement layer 23:
  a bandgap energy that changes stepwise and reducible to band gap wavelengths of 1.3 μm, 1.2 μm, 1.1 μm and 1.05 μm and a thickness of 300Å
non-doped GaInAsP quantum-well layers 25:
  a band gap wavelength of 1.67 μm and a thickness of 50Å
GaInAsP barrier layer 26:
  a band gap wavelength of 1.3 μm and a thickness of 100Å
non-doped GaInAsP optical confinement layer 27:
  a bandgap energy that changes stepwise and reducible to band gap wavelengths of 1.3 μm, 1.2 μm, 1.1 μm and 1.05 μm and a thickness of 300Å primary diffraction grating 28:

a pitch of less than 2,400Å and a height of 500Å

The optical confinement layer 27 may not have a primary diffraction grating 28 as described above.

While the composition of the GRIN-SCH region of the above described embodiment comprising the optical confinement layers 23, 27 changes stepwise, alternatively it may change in a continuous manner.

The embodiment of the semiconductor laser device illustrated in FIG. 1 can typically be prepared in a following way.

In the first process of an MOCVD method, an n-InP clad layer 22, a non-doped GaInAsP optical confinement layer 23 having a bandgap energy that changes stepwise, a multiple quantum-well layer 24 constituted by non-doped GaInAsP quantum-well layers 25 and a GaInAsP barrier layer 26 and a non-doped GaInAsP optical confinement layer 27 are grown on an n-InP substrate 21 on a continuous manner.

Then, a pattern of a primary diffraction grating 28 that has been prepared by means of a two-luminous flux interference exposure method is transferred to said optical confinement layer 27 by using a chemical etching technique.

In the second process of the MOCVD method, a p-InP clad layer 29 and a GaInAsP layer for processing are deposited and grown on the multi-layer structure on the n-InP substrate 21.

Thereafter, a vertical mesa having a width of approximately 2 μm is cut through the active layer and the optical confinement layer 27 by means of a known photolithography method and a chemical etching method.

In the third process of the MOCVD method, a buried layer 31 is grown at selected locations on the both lateral sides that cover the active layer by using SiO₂ film.

Then, the SiO₂ film and the GaInAsP layer used for processing are removed and, in the subsequent fourth process of the MOCVD method for planer, a p-InP clad layer 29 and a p-GaInAsP contact layer 30 are grown on the multi-layer structure on the n-InP substrate 21.

Thereafter, an n-side electrode 32 and a p-side electrode 33 are formed respectively on the lower surface of the substrate 21 and on the upper surface of the buried layer 31 and the obtained multi-layered structure is cleaved by any conventional means to form a laser chip and by turn produce a desired semiconductor laser device.

A semiconductor laser device prepared in this manner comprises an optical confinement layer 23, a multi-layered quantum-well layer 24 (quantum-well layers 25 and a barrier layer 26) and another optical confinement layer 27 having a primary diffraction grating 28 that have specified characteristic values.

The above described embodiment of the semiconductor laser device comprises a pair of quantum-well layers having a thickness of 7 nm.

The embodiment has quantum-well layers with a thickness smaller than that of the quantum-well layers of a semiconductor laser device whose quantum-well layers are GaInAsP quantum-well layers (band gap wavelength: 1.67 μm, thickness: approximately 8 μm) and contain a GaInAsP barrier layer (band gap wavelength: 1.3 μm) and therefore whose second quantum level is cut off. Therefore, it does not involve any second quantum level.

With the above described embodiment comprising one or more than one quantum-well layers having a thickness as described above can be made to oscillate at the first quantum level by selecting a low threshold carrier density and a low threshold current density.

It may be understood that the above description holds true for a semiconductor laser device according to the invention having only one quantum-well layer.

Some of the results of a series of experiments conducted by the inventors of the present invention will be described below by referring to FIGS. 2 through 6 and Table 1.

Figure 2:
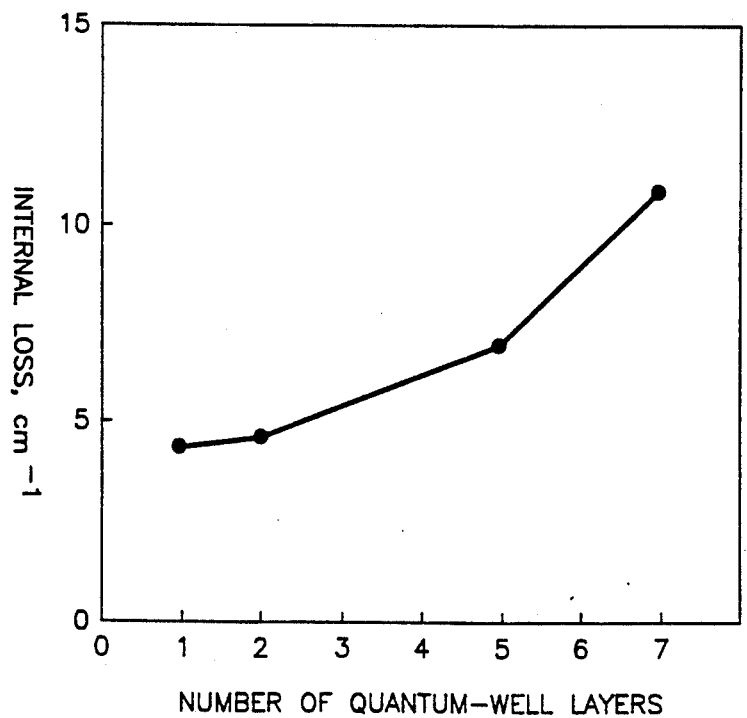
FIG. 2 is a graph showing the relationship between the number of quantum-well layers and the internal loss of a quantum-well type semiconductor laser device.
Figure 3:
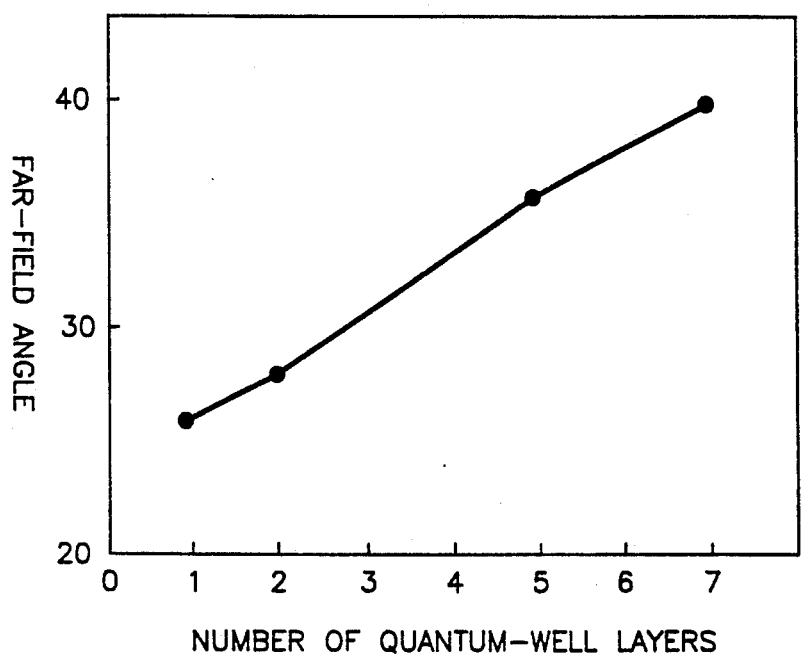
FIG. 3 is a graph showing the relationship between the number of quantum-well layers and the far-field angle of a quantum-well type semiconductor laser device.

FIGS. 2 and 3 respectively illustrate the internal loss and the far-field angle (as determined by referring to the direction perpendicular to the surface of the multi-layer structure) for semiconductor laser devices having respectively one, two, three and five quantum-well layers in the active layer.

From these graphs, it is apparent that a device with one or two quantum-well layers has an internal loss and a far-field angle smaller than that of a device having 3 or 5 quantum-well layers.

Figure 4:
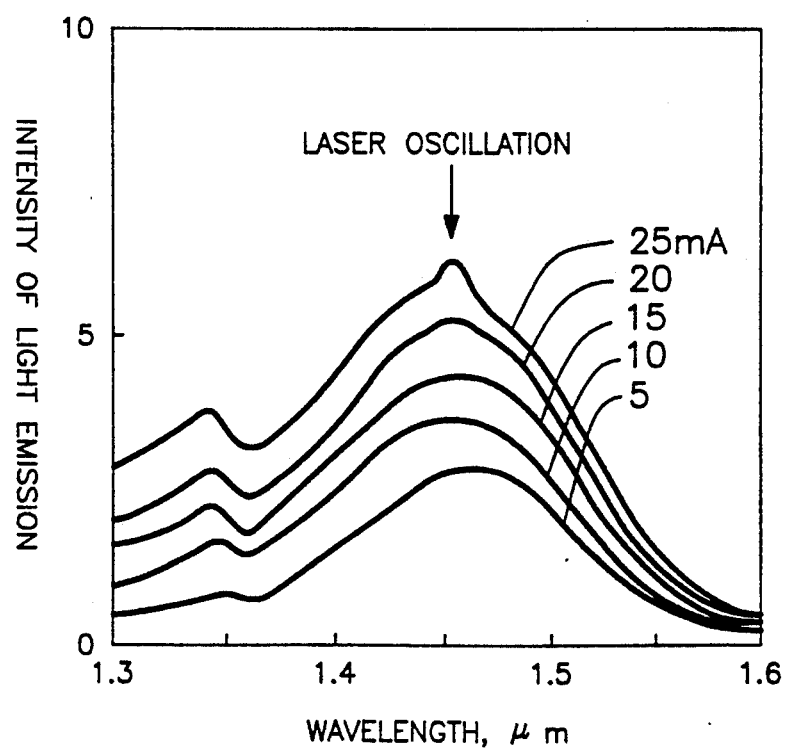
FIG. 4 is a graph showing the relationship between the wavelength and the intensity of light emission of a quantum-well type semiconductor laser device.
Figure 5:
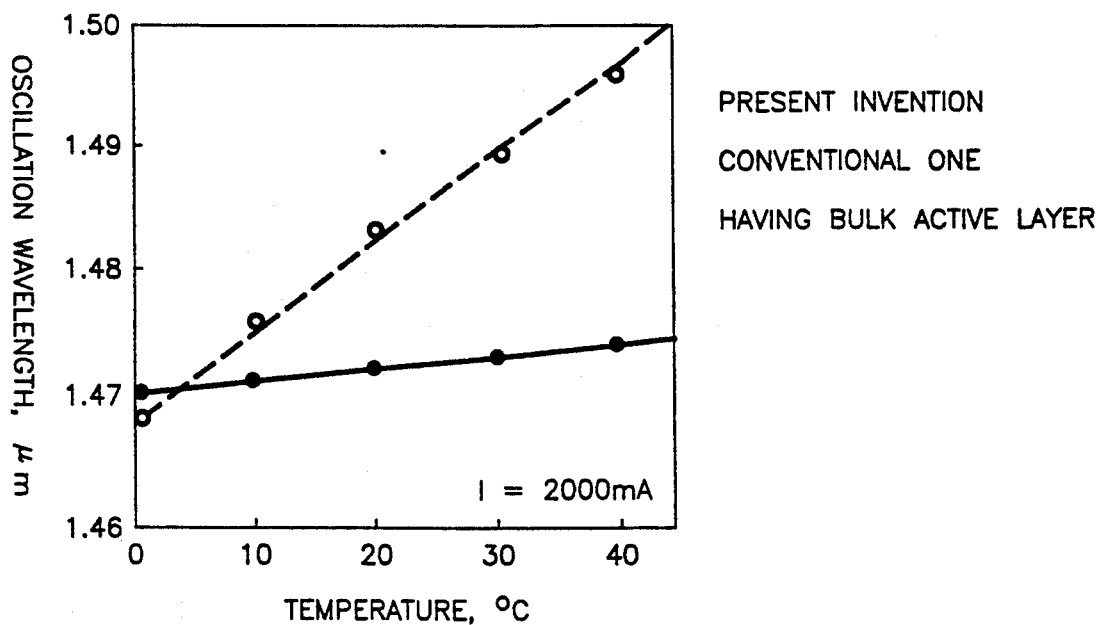
FIG. 5 is a graph showing the relationship between the oscillation wavelength and the temperature of a quantum-well type semiconductor laser device.

FIG. 4 illustrates the spectrum of spontaneously emitted light coming out of the surface of a buried type semiconductor laser device obtained to determine the quantum level of oscillation.

The cavity length of the device was 900 μm and the threshold current was 27 mA.

It is apparent from FIG. 4 that the peak of the spectrum at the wavelength of 1.45 μm corresponds to the first quantum level because no peaks of light emission are found on the longer wavelength side of the peak.

In an experiment of measuring the spectrum of spontaneously emitted light where the thickness of the quantum-well layers were changed, a stable oscillation wavelength that was not affected by temperature change was established for the first quantum level with a quantum-well layer thickness between 30 and 80Å.

Note that the above described results of measurement were for semiconductor laser devices having no primary diffraction grating 28.

Figure 6:
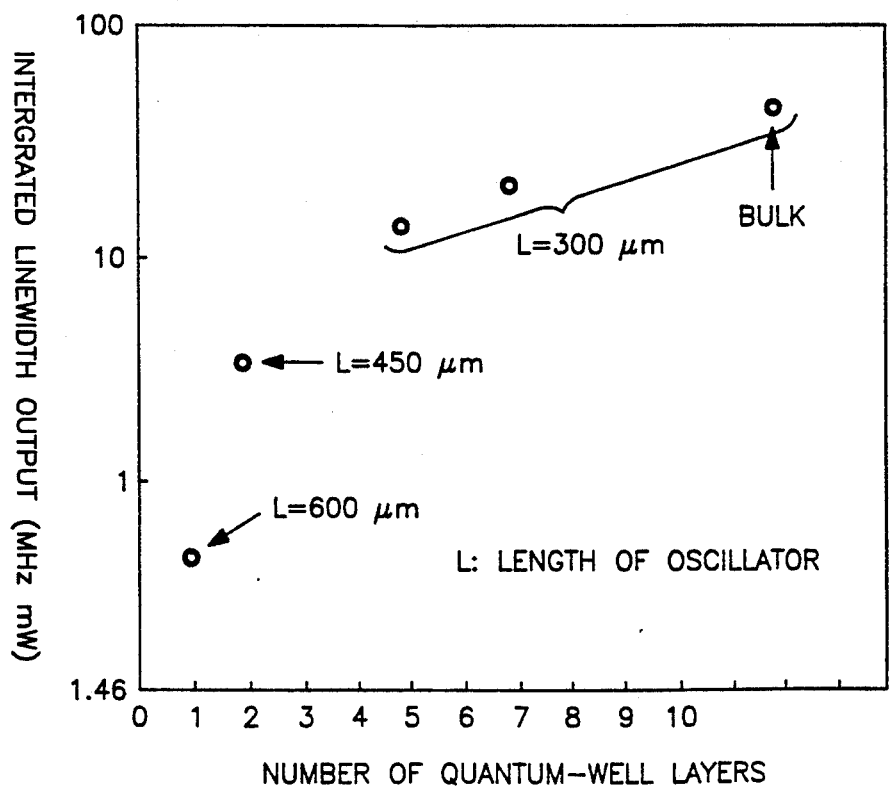
FIG. 6 is a graph showing the relationship between the number of quantum-well layers and the integrated linewidth output of a quantum-well type semiconductor laser device.
Figure 7:
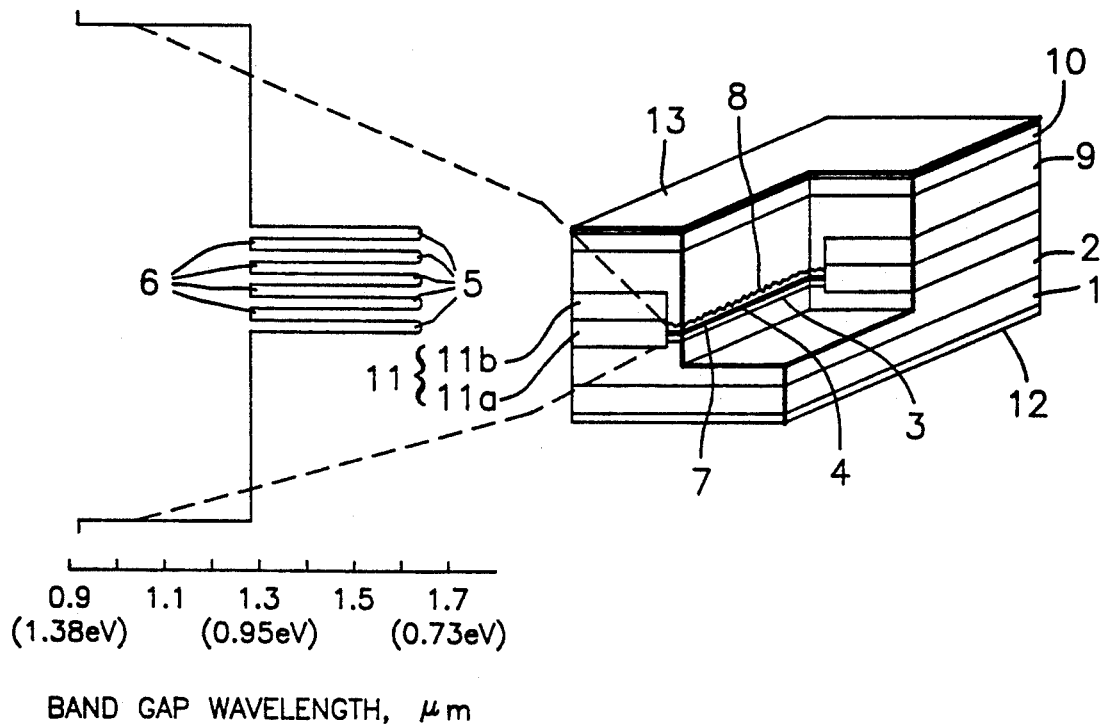
FIG. 7 is a partially cut out perspective view similar to FIG. 1 but showing a conventional quantum-well type semiconductor laser device with a graph of its band gap wave length.

FIG. 6 shows the relationship between the number of quantum-well layers and the integrated linewidth output of a quantum-well type semiconductor laser device.

As shown in FIG. 6, a semiconductor laser device according to the invention and having two quantum-well layers and a cavity length of 450 μm showed a linewidth output of 3.5 MHz.mW and another semiconductor laser device according to the invention and having a single quantum-well layer and a cavity length of 600 μm showed a linewidth of 0.45 MHz.mW, whereas a conventional semiconductor laser device having five quantum-well layers and a cavity length of 300 μm showed a linewidth output of 10 MHz-mW.

It may be understood from the above description that a semiconductor laser device comprising only one or two quantum-well layers has a high spectral purity.

Table 1 below shows the maximum output and the aspect ratio of the emitted beam pattern (elliptic rate) of three different semiconductor laser devices having a cavity

TABLE 1

|  | maximum output (mW) | aspect ratio |
|---|---|---|
| No. 1 | 150 | 1.05 |
| No. 2 | 130 | 1.1 |
| No. 3 | 100 | 1.5 |

In Table 1, No. 1 is a semiconductor laser device having only one quantum-well layer (conforming to the definition of the present invention), No. 2 is a semiconductor laser device having two quantum-well layers (also conforming to the definition of the present invention) and No. 3 is a semiconductor laser device having five quantum-well layers (not conforming to the definition of the present invention).

It is apparent from Table 1 that the devices of Nos. 1 and 2 have a maximum output greater than that of the device of No. 3 and a substantially circular emission pattern of output beams. These characteristics are attributable to the fact that the former has a small optical confinement coefficient.

It should be noted that the semiconductor laser devices of Nos. 1 and 2 can be connected with an optical fiber at an elevated efficiency because of the substantially circular emission patter of output beams.

The component layers of the above described semiconductor laser devices according to the invention are of mutual lattice miss-match.

When the amount of strain in the InP substrate and/or optical confinement layers relative to the $Ga_xIn_{1-x}As_yP_{1-y}$ ($x \geq 0$, $y \leq$) semiconductive layers of a semiconductor laser device according to the invention is between 0 and 2%, it exhibits an improved spectral purity if layers having the amount of strain between 0 and 2% relative to the quantum-well layers are used.

It should be noted that the thickness of the quantum-well active layer should be equal to or less than the critical layer thickness.

As described above, by limiting the number of quantum-well layers of a quantum-well type semiconductor laser device according to the invention and comprising a multi-layered quantum-well layer (active layer) constituted by quantum-well layers and a corresponding number of barrier layers and a pair of optical confinement layers respectively arranged on and under the active layer to one or two, the device has a reduced internal loss, a narrowed far-field angle and a bandgap energy of the quantum-well layers greater than that of the optical confinement layers by more than 160 meV so that it shows a lowered threshold current density. Besides, by selecting a thickness of the quantum-well layers between 3 and 8 nm, the device can be made to oscillate at the first quantum level in order to make the oscillation wavelength highly dependent on temperature and optical output and accordingly produce a high spectral purity.

For a quantum-well type semiconductor laser device according to the invention, the carrier can be effectively confined within the quantum-well layer(s) and oscillation at the first quantum level can be stabilized when an InP layer having a bandgap energy greater than that of the optical confinement layers is arranged outside the latter.

The threshold current density of a quantum-well type semiconductor laser device according to the invention can be further reduced and the quantum efficiency can be further enhanced when the amount of strain in the quantum-well layer(s) of the semiconductor laser device is between 0 and 2% relative to the InP substrate and/or the optical confinement layers.

When the cavity length of a quantum-well type semiconductor laser device according to the invention is greater than 900 μm, the semiconductor laser device additionally shows a reduced resistance and an enhanced heat diffusing capability to ensure its high output operation.

What is claimed is:

1. A quantum-well type semiconductor laser device comprising a resonant cavity, an active layer comprising no more than two quantum-well layers and a barrier layer, and a pair of $Ga_xIn_{1-x}As_yP_{1-y}$ ($x \geq 0$, $y \leq 1$) semiconductive optical confinement layers arranged above and below said active layer, said layers being formed on an InP substrate in a given arrangement, first and second electrodes on opposite sides, respectively of the quantum-well layer(s), and wherein the bandgap energy of the optical confinement layers is greater than that of the quantum-well layer(s) by 16 meV and the thickness of the quantum-well layer(s) is between 3 nm and 8 nm.

2. A quantum-well type semiconductor laser device according to claim 1, and further comprising an InP layer arranged outside the optical confinement layers and having a bandgap energy greater than that of the optical confinement layers.

3. A quantum-well type semiconductor laser device according to claim 2, wherein the amount of strain in the quantum-well layers of said device is between 0 and 2% relative to the InP substrate and/or the optical confinement layers.

4. A quantum-well type semiconductor laser device according to claim 1, wherein the resonant cavity of said device has a length greater than 900 μm.

* * * * *